(12) United States Patent
Cameron

(10) Patent No.: US 7,032,138 B2
(45) Date of Patent: Apr. 18, 2006

(54) GENERALIZED CONVOLUTIONAL INTERLEAVER/DE-INTERLEAVER

(75) Inventor: Kelly Brian Cameron, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 297 days.

(21) Appl. No.: 10/718,894

(22) Filed: Nov. 21, 2003

(65) Prior Publication Data

US 2004/0117713 A1 Jun. 17, 2004

Related U.S. Application Data

(63) Continuation of application No. 10/325,525, filed on Dec. 19, 2002, now Pat. No. 6,697,975, which is a continuation of application No. 09/430,456, filed on Oct. 29, 1999, now Pat. No. 6,546,520.

(60) Provisional application No. 60/106,482, filed on Oct. 30, 1998.

(51) Int. Cl.
*G06F 11/00* (2006.01)

(52) U.S. Cl. .................. 714/701; 714/786; 714/788
(58) Field of Classification Search .............. 714/701, 714/786, 788, 755
See application file for complete search history.

(56) References Cited

U.S. PATENT DOCUMENTS

| | | | | |
|---|---|---|---|---|
| 5,483,541 A | * | 1/1996 | Linsky ..................... 714/701 |
| 5,572,532 A | * | 11/1996 | Fimoff et al. ............... 714/702 |
| 6,411,654 B1 | * | 6/2002 | Furutani et al. ............. 375/262 |

* cited by examiner

*Primary Examiner*—Phung My Chung
(74) *Attorney, Agent, or Firm*—Garlick Harrison & Markison LLP; Shayne X. Short

(57) ABSTRACT

A memory-efficient convolutional interleaver/de-interleaver with a memory array, a write commutator, and a read commutator wherein the commutators perform their respective write and read operations relative to a preselected memory cell after a predetermined delay. The delay is chosen using a modulo-based technique, such that an efficient implementation of a Ramsey Type-II interleaver is realized.

20 Claims, 2 Drawing Sheets

GENERALIZED CONVOLUTIONAL INTERLEAVER/DE-INTERLEAVER

CROSS REFERENCE TO RELATED PATENTS/PATENT APPLICATIONS

The present U.S. Utility Patent Application is a continuation of the following U.S. Utility Patent Application which is hereby incorporated herein by reference in its entirety and made part of the present U.S. Utility Patent Application for all purposes:

1. U.S. Utility patent application Ser. No. 10/325,525, entitled "Generalized convolutional interleaver/de-interleaver," filed Dec. 19, 2002 (Dec. 19, 2002), now U.S. Pat. No. 6,697,975.

The U.S. Utility patent application Ser. No. 10/325,525 is a continuation of the following U.S. Utility Patent Application which is hereby incorporated herein by reference in its entirety and made part of the present U.S. Utility Patent Application for all purposes:

1. U.S. Utility patent application Ser. No. 09/430,456, entitled "Generalized convolutional interleaver/de-interleaver," filed on Oct. 29, 1999 (Oct. 29, 1999), which issued as U.S. Pat. No. 6,546,520 on Apr. 8, 2003 (Apr. 08, 2003).

The U.S. Utility patent application Ser. No. 09/430,456 claims priority pursuant to 35 U.S.C. § 119(e) to the following U.S. Provisional Patent Applications which is hereby incorporated herein by reference in its entirety and made part of the present U.S. Utility Patent Application for all purposes:

1. U.S. Provisional Patent Application Ser. No. 60/106,482, entitled "Efficient convolutional interleavers/de-interleavers," filed Oct. 30, 1998 (Oct. 30, 1998), pending.

BACKGROUND OF THE INVENTION

1. Technical Field of the Invention

The invention relates to an apparatus and method for convolutional interleaving/deinterleaving.

2. Description of Related Art

Present digital communication channels are experiencing greatly increased demands, which lead to errors in the data being transmitted in that channel. The error correcting codes in common use are very good at detecting and correcting isolated bit errors which occur in a communication channel. However, typical error correction and detection codes are insufficient in a channel which is subject to burst-type errors, i.e., errors which will affect a large number of bits of data at a time.

Convolutional interleaving and de-interleaving techniques on either end of the channel transmission path are used to interleave the data stream, so that the effects of burst errors become distributed when the data stream is de-interleaved, and do not overwhelm the error correcting and detecting codes.

A balance often must be maintained among considerations such as, for example, the physical amount of memory used to realize the interleaver/de-interleaver, the total amount of device "real estate" available to the device designer, the device performance, device flexibility and dynamic re-programmability, and the simplicity of the device design and implementation. In applications where the importance of spatial efficiency is less important, the interleaver/de-interleaver can be implemented using an arbitrary number of memory cells, provided the requisite device performance characteristics are met. Often, interleavers/de-interleavers are realized using distinct designs and implementations, which cannot be reconfigured dynamically to satisfy, for example, the demands of a different environment requiring the use of a different type of interleaver/de-interleaver.

The tension of this balance is most prominent in single-chip signal processing device implementations, where spatial efficiency can become a crucial consideration. There is a need for efficient implementations of certain types of interleavers/de-interleavers, including, for example, a Ramsey Type II device, have not been demonstrated. Furthermore, there is a need for an interleaver/de-interleaver that can be dynamically reconfigurable among the different types of devices, for example, Ramsey I, Ramsey II, Ramsey III, and Ramsey IV.

BRIEF SUMMARY OF THE INVENTION

The invention provides a memory-efficient convolutional interleaver/de-interleaver which includes a memory array, a write commutator, and a read commutator; wherein the commutators perform their respective write and read operations relative to a preselected memory cell after a predetermined delay. The delay is chosen using a technique, such as a modulo-based technique, such that an efficient implementation of a Ramsey Type-II interleaver, and a Ramsey Type-III is realized.

DETAILED DESCRIPTION OF THE INVENTION

Figure 1:
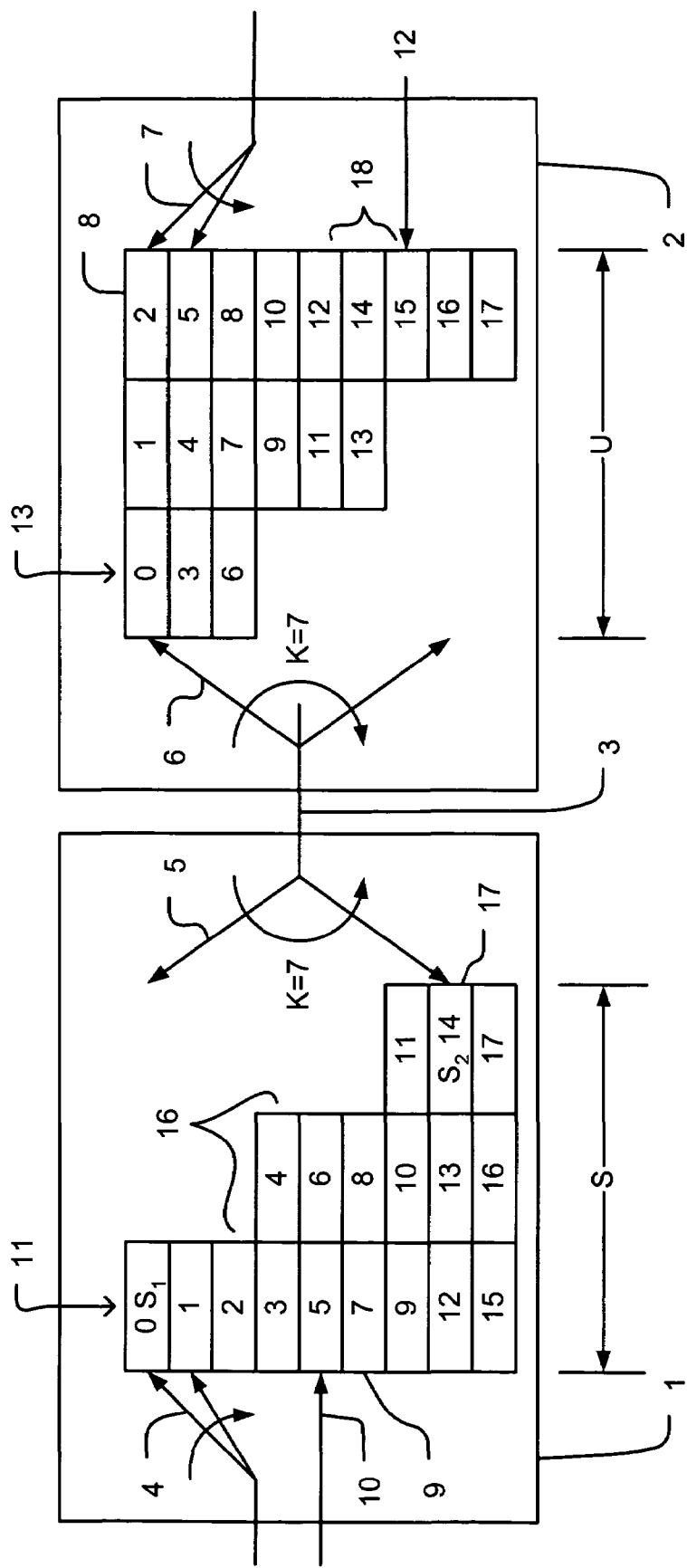
FIG. 1 is an exemplary illustration of an embodiment of the present invention, in the form of a Ramsey Type-II interleaver.

Although convolutional interleavers/de-interleavers are well known in the art, the design of memory-efficient devices approaching the theoretical minimum number of memory locations has been elusive, particularly interleavers/de-interleavers of the Ramsey II-type. The invention herein provides a generalized memory-efficient interleaver/de-interleaver that can be reconfigured to selectively operate as distinct devices, such as a Ramsey I-, Ramsey II-, Ramsey, III-, or Ramsey IV-type interleaver/de-interleaver. The implementation of the Ramsey-II type of device according to the present invention is substantially efficient, to the extent where such a design can approach a theoretical minimum number of memory cells.

The concept of convolutional interleaving was first introduced by J. L. Ramsey and G. D. Forney in around 1970. See, for example, J. L. Ramsey, "Realization of Optimum Interleavers," IEEE Information Theory, Vol. IT-16, Number 3, May 1970, pp. 338–345; and G. D. Forney, "Burst-Correcting Codes for the Classic Bursty Channel," IEEE Trans. Communication Technology, Vol. COM-19, October 1971, pp. 772–781. When convolutional interleaving is used, the total memory requirements can theoretically be reduced to approximately N*d. The reduction in memory results in a memory requirement which is one-fourth the requirement of block interleaving. At the same time, the overall latency is reduced by up to approximately the same level (i.e., N*d). This is approximately half of the total latency of a block interleaver.

The implementations of convolutional interleaving described by Ramsey and Forney as well as others are capable of achieving the reduction of required memory by up to a factor of 4 through the use of 2*N separate delay lines. Each of the delay lines can be implemented by a RAM with its own address. However, when the number of symbols in a block of data N is relatively large, a correspondingly large number of separate RAMS are required in order to implement the interleaver. In order to improve the efficiency of the system, it would be desirable to consolidate these memories into a relatively small number of RAMS.

U.S. Pat. No. 4,559,625, entitled "Interleavers for Digital Communications," issued Dec. 17, 1985 to E. R. Berlekamp, et al. describes an interleaving system that requires only one RAM for the interleaver and one additional RAM for the de-interleaver. However, in the described implementation, which is referred to as "helical" interleaving, the interleaving depth d is restricted to a value that is one greater or one less than the number of symbols in a block of data N. That is, D=N±1. Although the "helical" interleaver disclosed by Berlekamp, et al. works well in some applications, it is limited in that it cannot be used in applications which require different relationships between the interleaving depth and the number of symbols in a block of data.

More recently, J. T. Aslanis, et al. described a convolutional interleaving system that permits an arbitrary interleaving depth d wherein the only restriction on the interleaving depth d is that it must be co-primed with the number of symbols in a block of data N. The described system uses a single RAM implementation with a total memory requirement equivalent to 2*N*d. See generally, Aslanis et al. "An ADSL Proposal for Selectable Forward Error Correction with Convolutional Interleaving", TIEI.4/92–180, Aug. 20, 1992. It should be appreciated that although this system requires just half of the memory required by the block interleaver, it still requires an amount of memory which is approximately twice as high as the theoretical minimum.

Also, U.S. Pat. No. 5,764,649, entitled, "Efficient Address Generation For Convolutional Interleaving Using A Minimal Amount Of Memory," issued Jun. 9, 1998 to PO Tong, describes an addressing scheme which uses a more reduced amount of memory in the interleaving and deinterleaving process, thereby achieving a significant savings in memory requirements. However, to realize this savings, a rather involved addressing scheme is required which involves generating several arrays which characterize the delays relating to each symbol, as well as the addresses for both the interleaver and the de-interleaver.

Each of the above-described references is incorporated herein in its respective entirety.

The present invention provides a generalized, memory-efficient, convolutional interleaver/de-interleaver, the configuration of which can be dynamically selectable. For the purposes of clarity, and due to the duality between an interleaver and a de-interleaver, an interleaver/de-interleaver will be called an interleaver, as will be understood by skilled artisans. Also known to skilled artisans, a Ramsey Type-I interleaver is the dual of a Ramsey Type-II interleaver, and a Ramsey Type-III interleaver is the dual of a Ramsey Type-IV interleaver. Therefore, a Ramsey Type-I interleaver can be used as a de-interleaver when used in conjunction with a Ramsey Type-II interleaver.

In its most general form, an interleaver includes an array of memory cells, a write commutator and a read commutator. It is desirable for each of the commutators to have their positions relative to the previous position in memory cells updated, according to a preselected technique, at least one of which being a modulo-based technique. Where only one technique is a modulo-based, the other preselected technique can include updating the respective commutator by an offset of one or more positions, relative to the previous position in the memory cells.

FIG. 1 illustrates an exemplary embodiment of a Ramsey Type II interleaver/de-interleaver. As shown in FIG. 1, the present invention comprehends an interleaver 1, and a de-interleaver 2, that convey information through a data channel 3. Each of interleavers 1, 2 are shaped approximately like a triangular memory array. Interleaver 1 includes write commutator 4, read commutator 5, and plural rows 16, 17 of memory array 9. In general, each interleaver and de-interleaver has one write commutator and one read commutator. Interleaver 1 also includes row position pointer 11; it is desirable for each row 16, 17 in memory array 9 have a row position pointer 11 associated therewith. De-interleaver 2 includes write commutator 6, read commutator 7, plural rows 18 of memory array 8, and row position pointer 13.

In the invention herein, memory locations can be referenced by row and row position. Typically, the row position is selected by the read/write commutator; and the position within a given row is selected by the row position pointer.

In this example, commutators 4, 6 are write commutators; and commutators 5, 7 are read commutators. For the purposes of clarity, the following exemplary process will be described from the perspective of interleaver 1; based on this information, a skilled practitioner can readily extend the process to de-interleaver 2. It is desirable, but not necessary, that commutators 4, 5 be initialized to the top row of the memory array. A symbol $S_1$ can be written at a first time to a first row 16 pointed to by write commutator 4. Also, symbol $S_2$ can be read at a second time, from second row 17 which is pointed to by read commutator 5. At this point, both pointers can be updated according to at least one predetermined update technique. It is desirable that read commutator 5 (and write commutator 6) be updated using a predetermined modulo technique. It is most desirable that a commutator "wraps" back on the array in an appropriate manner when the end of an array is reached.

Commutator updates can be made using many schemes, one being:

$$\text{CommutatorPos}_{i+1} = (\text{CommutatorPos}_i + H) \bmod N$$

where: rows are labeled $0 \leq R < N$;

N is the total number of rows; and H can be either 1 or K, where K is computed by solving the equation:

$$KD \bmod N \equiv 1$$

It will be apparent to those skilled in the art that the difference between the second time and first time is representative of a predetermined delay that, in turn represents a preselected number of symbols $S_1$. Each row 16, 17 of memory array 9 can have a row position pointer 11 associated therewith, by which, the memory location for symbol $B_1$, can be selected for a respective read or write operation. Initial access to row 16 can be performed to an arbitrary position within row 16. It also is desirable that a read operation update row position pointer 11.

Row position pointer 11 of a given row 16, 17 can be updated in conjunction with a read operation or a write operation. It is desirable to update row position pointer 11 in conjunction with a write operation when interleaving, and with a read operation when deinterleaving. Typically, read and write operations occur in pairs, with a read-after-write sequence being desirable. In such a case, row position pointer 11 can be post-incremented if it is updated in conjunction with a write operation, and pre-incremented if it is updated in conjunction with a read operation, with the reverse becoming a desirable sequence if the read operation precedes the write operation.

The row position increment operation can include any method of successively pointing to individual memory locations in a given row 16. One such method can include:

RowPos$_{i+1}$=RowPos$_i$+L mod RowSize where L is an integer such that:

gcd(L, RowSize)=1

Other patterns and schemes may be used as well, for example, any such method which selects the elements in a given row, in any order. It is desirable that, once all elements have been selected, the selection sequence repeats.

Prior to a read operation row position pointer 11 is incremented using a preselected technique, such as, for example, a modulo technique, with the last position of a given row incrementing back to the first location of a row. The read operation is then performed from the location indicated by row position pointer 11. Where a write operation is used for updating, row position pointer 11 can be updated using a preselected modulo technique. In general, the modulo technique according to the present invention comprehends moving the appropriate commutator by a {modulo(number of rows)} displacement.

In the case of interleaver 1, write commutator 4 can be incremented by a fixed amount, or offset, for example, one position, after each write operation. When the last row of array 9 is reached, the commutator position wraps back around to the starting row of array 9 such that the entire cycle is repeated. Currently, it is desirable for read commutator 5 to be updated by K positions after each read operation. After successive read/write operations, the last row of the array is passed, and the position of read commutator 5 is updated by K rows. Using the desired interleaver block length N and interleave depth D, and interleave increment offset K can be computed by solving the equation:

KD mod N=1

Where memory array 9 consists of N rows of memory cells, and the index, R, of a logical sequential arrangement of the memory cells satisfies:

0≤R<N;

starting with the top row, the size of each row in the logical arrangement can be given by:

$$S = \left\lfloor \frac{(D-1)}{N}R \right\rfloor + 1$$

where $\lfloor \ \rfloor$ is the floor operator.

Similarly, the size of each row of the de-interleaver array can be given by:

$$U = \left\lfloor \frac{(D-1)}{N}(N-1-R) \right\rfloor + 1$$

As a result, the total number of memory locations, M, required to implement either the interleaver or the de-interleaver can be determined by:

$$M = \frac{(N-1)D + gcd(N, D-1) + 1}{2}$$

where N and D are arbitrarily selectable parameters, as long as gcd(N,D)=1.

The operation of de-interleaver 2 is logically similar to that of interleaver 1 in that write commutator 6 of de-interleaver 2 performs write operations on memory array 8 using an increment offset K for the repositioning of commutator 6, in the manner that read commutator 5 of interleaver 1 performs read operations on memory array 9 using the offset K for the repositioning of commutator 6.

In the case where rows are sequentially indexed, it is apparent that the length of the rows so configured either remains the same or increases, as a result of the floor operator function. Similarly, the length of the rows in de-interleaver 2 will remain the same of decrease. There is no requirement that the logical configuration of the memory correspond with the physical configuration, so that it is possible to substitute one row for another row. However, it is desirable that the interchanged rows be of the same length.

Figure 2:
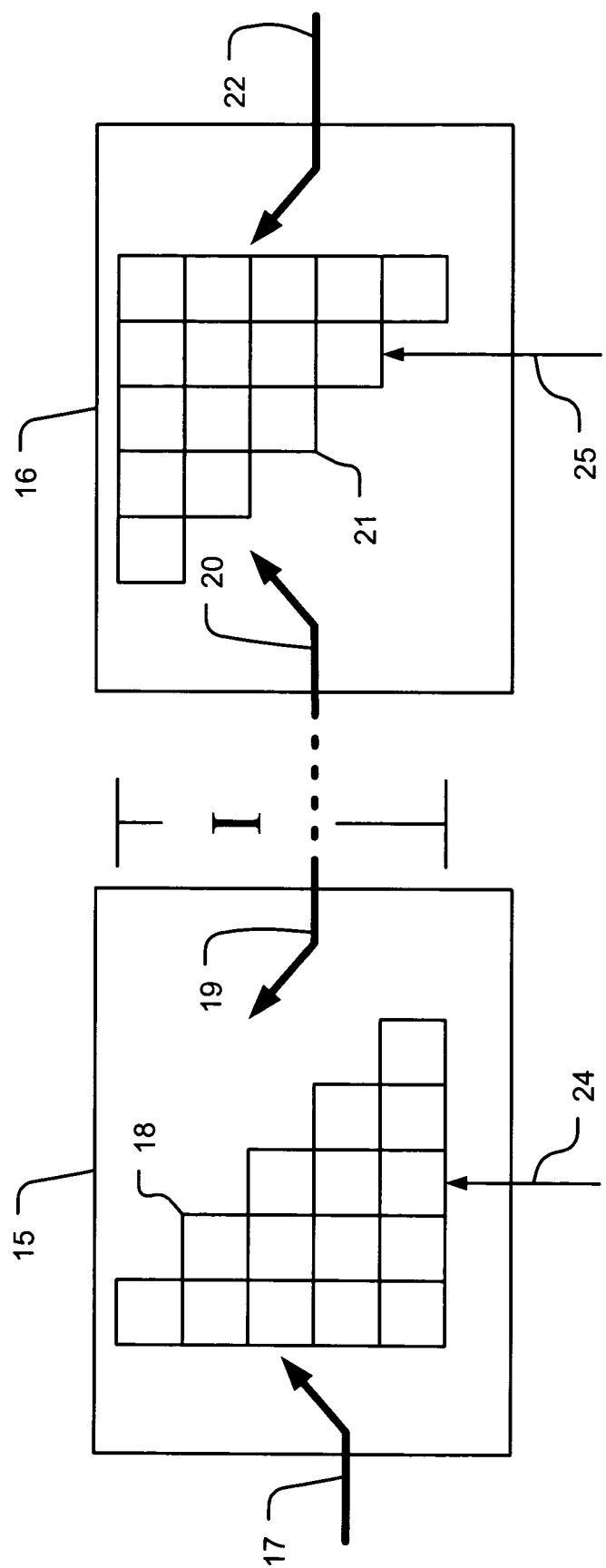
FIG. 2 is an exemplary illustration of an embodiment of the present invention, in the form of a Ramsey Type-III interleaver.

FIG. 2 illustrates a Ramsey Type-III interleaver 15 and a Ramsey Type-.IV device 16 as the corresponding de-interleaver. As with devices 1, 2, devices 15, 16 respectively employ write commutators 17, 20; read commutators 19, 22; and row position pointers 24, 25 to perform interleaving and deinterleaving in respective memory arrays 18, 21. Similar to the number of rows, N, in FIG. 1, devices 15, 16 are designed to use I rows of memory cells. As with interleavers 1, 2, the operation of commutators 19, 20, and perhaps, row position pointers 24, 25, can employ a selected modulo-based technique. It is most desirable that each of the commutators 17 and 22, and 19 and 20, and the row position pointers, 24, 25, be synchronized.

The foregoing merely illustrates the principles of the invention, and it will thus be appreciated that those skilled in the art will be able to devise various alternative arrangements which, although not explicitly described herein, embody the principles of the invention within the spirit and scope of the following claims.

What is claimed is:

1. A flexible and dynamically reconfigurable convolutional interleaver/de-interleaver that is operable to interleave/de-interleave a plurality of symbols, the interleaver/de-interleaver comprising:

an interleaver;

a de-interleaver that is communicatively coupled to the interleaver via a data channel;

wherein each of the interleaver and the de-interleaver includes a corresponding memory cell array, operable to store symbols therein, that includes a plurality of memory cells functionally operable to support a substantially triangular memory configuration to include a plurality of interleaver/de-interleaver array rows such that each memory cell of the memory cell array may be referenced by a row and a row position;

wherein each of the corresponding memory cell arrays is characterized by a memory block length and an interleave depth;

wherein each of the interleaver and the de-interleaver includes a corresponding write commutator, operable to communicatively couple to any interleaver/de-interleaver array row of the plurality of interleaver/de-interleaver array rows, that is operable to write a symbol to a memory cell of the memory cell array at a first time;

wherein each of the interleaver and the de-interleaver includes a corresponding first row position pointer that synchronizes with its corresponding write commutator to select the memory cell by referencing the row and the row position of the memory cell when the write commutator performs a write operation;

wherein each of the interleaver and the de-interleaver includes a corresponding read commutator, operable to communicatively couple to any interleaver/de-interleaver array row of the plurality of interleaver/de-interleaver array rows, that is operable to read the symbol from the memory cell of the memory cell array at a second time;

wherein each of the interleaver and the de-interleaver includes a corresponding second row position pointer that synchronizes with its corresponding read commutator to select the memory cell by referencing the row and the row position of the memory cell when the read commutator performs a read operation;

wherein at least one of the first row position pointer, the interleaver array row to which the write commutator communicatively couples, the second row position pointer, and the interleaver array row to which the read commutator communicatively couples is updated by incrementing it by a positive valued integer;

wherein the positive valued integer multiplied by the interleave depth and multiplied by a modulo function of the memory block length results in a constant value;

wherein a difference between the first time and the second time is a predetermined selectable delay that corresponds to a preselected number of symbols to be interleaved/de-interleaved by the interleaver/de-interleaver in its particular configuration; and wherein the particular configuration of the interleaver/de-interleaver is selected from among a predetermined plurality of configurations in which the interleaver/de-interleaver may be configured.

2. The interleaver/de-interleaver of claim 1, wherein:
the first row position pointer and the interleaver/de-interleaver array row to which the write commutator communicatively couples are updated after the write commutator performs the write operation; and
the second row position pointer and the interleaver/de-interleaver array row to which the read commutator communicatively couples are updated after the write commutator performs the write operation.

3. The interleaver/de-interleaver of claim 1, wherein:
the first row position pointer and the interleaver/de-interleaver array row to which the write commutator communicatively couples are updated before the read commutator performs the read operation; and
the second row position pointer and the interleaver/de-interleaver array row to which the read commutator communicatively couples are updated before the read commutator performs the read operation.

4. The interleaver/de-interleaver of claim 1, wherein:
the write operation performed by the write commutator directs the updating of at least one of the first row position pointer, the interleaver/de-interleaver array row to which the write commutator communicatively couples, the second row position pointer, and the interleaver/de-interleaver array row to which the read commutator communicatively couples.

5. The interleaver/de-interleaver of claim 1, wherein:
the interleaver/de-interleaver is implemented as a Ramsey Type II interleaver/de-interleaver.

6. A flexible and dynamically reconfigurable convolutional interleaver that is operable to interleave a plurality of symbols, the interleaver comprising:

a memory cell array, operable to store symbols therein, that includes a plurality of memory cells functionally operable to support a substantially triangular memory configuration to include a plurality of interleaver array rows such that each memory cell of the memory cell array may be referenced by a row and a row position;

wherein the memory cell array is characterized by a memory block length and an interleave depth;

a write commutator, operable to communicatively couple to any interleaver array row of the plurality of interleaver array rows, that is operable to write a symbol to a memory cell of the memory cell array at a first time;

a first row position pointer that synchronizes with the write commutator to select the memory cell by referencing the row and the row position of the memory cell when the write commutator performs a write operation;

a read commutator, operable to communicatively couple to any interleaver array row of the plurality of interleaver array rows, that is operable to read the symbol from the memory cell of the memory cell array at a second time;

a second row position pointer that synchronizes with the read commutator to select the memory cell by referencing the row and the row position of the memory cell when the read commutator performs a read operation;

wherein at least one of the first row position pointer, the interleaver array row to which the write commutator communicatively couples, the second row position pointer, and the interleaver array row to which the read commutator communicatively couples is updated by incrementing it by a positive valued integer;

wherein the positive valued integer multiplied by the interleave depth and multiplied by a modulo function of the memory block length results in a constant value;

wherein a difference between the first time and the second time is a predetermined selectable delay that corresponds to a preselected number of symbols to be interleaved by the interleaver in its particular configuration; and wherein the particular configuration of the interleaver is selected from among a predetermined plurality of configurations in which the interleaver may be configured.

7. The interleaver of claim 6, wherein:
the first row position pointer and the interleaver array row to which the write commutator communicatively couples are updated after the write commutator performs the write operation; and
the second row position pointer and the interleaver array row to which the read commutator communicatively couples are updated after the write commutator performs the write operation.

8. The interleaver of claim 6, wherein:
the first row position pointer and the interleaver array row to which the write commutator communicatively couples are updated before the read commutator performs the read operation; and the second row position pointer and the interleaver array row to which the read commutator communicatively couples are updated before the read commutator performs the read operation.

9. The interleaver of claim 6, wherein:
the write operation performed by the write commutator directs the updating of at least one of the first row position pointer, the interleaver array row to which the write commutator communicatively couples, the second row position pointer, and the interleaver array row to which the read commutator communicatively couples.

10. The interleaver of claim 6, wherein:
the interleaver is implemented as a Ramsey Type II interleaver.

11. A flexible and dynamically reconfigurable convolutional de-interleaver that is operable to de-interleave a plurality of interleaved symbols, the de-interleaver comprising:
a memory cell array, operable to store symbols therein, that includes a plurality of memory cells functionally operable to support a substantially triangular memory configuration to include a plurality of de-interleaver array rows such that each memory cell of the memory cell array may be referenced by a row and a row position;
wherein the memory cell array is characterized by a memory block length and an interleave depth;
a write commutator, operable to communicatively couple to any de-interleaver array row of the plurality of de-interleaver array rows, that is operable to write a symbol to a memory cell of the memory cell array at a first time;
a first row position pointer that synchronizes with the write commutator to select the memory cell by referencing the row and the row position of the memory cell when the write commutator performs a write operation;
a read commutator, operable to communicatively couple to any de-interleaver array row of the plurality of de-interleaver array rows, that is operable to read the symbol from the memory cell of the memory cell array at a second time;
a second row position pointer that synchronizes with the read commutator to select the memory cell by referencing the row and the row position of the memory cell when the read commutator performs a read operation;
wherein at least one of the first row position pointer, the de-interleaver array row to which the write commutator communicatively couples, the second row position pointer, and the de-interleaver array row to which the read commutator communicatively couples is updated by incrementing it by a positive valued integer;
wherein the positive valued integer multiplied by the interleave depth and multiplied by a modulo function of the memory block length results in a constant value;
wherein a difference between the first time and the second time is a predetermined selectable delay that corresponds to a preselected number of symbols to be de-interleaved by the de-interleaver in its particular configuration; and
wherein the particular configuration of the de-interleaver is selected from among a predetermined plurality of configurations in which the de-interleaver may be configured.

12. The interleaver of claim 11, wherein:
the first row position pointer and the de-interleaver array row to which the write commutator communicatively couples are updated after the write commutator performs the write operation; and
the second row position pointer and the de-interleaver array row to which the read commutator communicatively couples are updated after the write commutator performs the write operation.

13. The de-interleaver of claim 11, wherein:
the first row position pointer and the de-interleaver array row to which the write commutator communicatively couples are updated before the read commutator performs the read operation; and
the second row position pointer and the de-interleaver array row to which the read commutator communicatively couples are updated before the read commutator performs the read operation.

14. The de-interleaver of claim 11, wherein:
the write operation performed by the write commutator directs the updating of at least one of the first row position pointer, the de-interleaver array row to which the write commutator communicatively couples, the second row position pointer, and the de-interleaver array row to which the read commutator communicatively couples.

15. The de-interleaver of claim 11, wherein:
the de-interleaver is implemented as a Ramsey Type II de-interleaver.

16. A flexible and dynamically reconfigurable method for convolutional interleaving a plurality of symbols, the method comprising:
selecting an interleaving configuration from among a predetermined plurality of interleaving configurations;
configuring a memory cell array to interleave the plurality of symbols according to the selected interleaving configuration, wherein the memory cell array is operable to store symbols therein, wherein the memory cell array includes a plurality of memory cells functionally operable to support a substantially triangular memory configuration to include a plurality of interleaver array rows such that each memory cell of the memory cell array may be referenced by a row and a row position, wherein the memory cell array is characterized by a memory block length and an interleave depth;
writing a symbol to a memory cell of the memory cell array at a first time using a write commutator that is operable to communicatively couple to any interleaver array row of the plurality of interleaver array rows;
synchronizing a first row position pointer with the write commutator to select the memory cell by referencing the row and the row position of the memory cell when the write commutator performs a write operation;
reading the symbol from the memory cell of the memory cell array at a second time using a read commutator that is operable to communicatively couple to any interleaver array row of the plurality of interleaver array rows;
synchronizing a second row position pointer with the read commutator to select the memory cell by referencing the row and the row position of the memory cell when the read commutator performs a read operation; and
updating at least one of the first row position pointer, the interleaver array row to which the write commutator communicatively couples, the second row position pointer, and the interleaver array row to which the read commutator communicatively couples by incrementing it by a positive valued integer, wherein the positive valued integer multiplied by the interleave depth and multiplied by a modulo function of the memory block length results in a constant value, wherein a difference between the first time and the second time is a predetermined selectable delay that corresponds to a preselected number of symbols to be interleaved by the interleaver in its particular configuration.

17. The method of claim 16, further comprising:

updating the first row position pointer and the interleaver array row to which the write commutator communicatively couples after the write commutator performs the write operation; and updating the second row position pointer and the interleaver array row to which the read commutator communicatively couples after the write commutator performs the write operation.

18. The method of claim 16, further comprising:

updating the first row position pointer and the interleaver array row to which the write commutator communicatively couples before the read commutator performs the read operation; and updating the second row position pointer and the interleaver array row to which the read commutator communicatively couples before the read commutator performs the read operation.

19. The method of claim 16, further comprising:

using the write operation performed by the write commutator to direct the updating of at least one of the first row position pointer, the interleaver array row to which the write commutator communicatively couples, the second row position pointer, and the interleaver array row to which the read commutator communicatively couples.

20. The method of claim 16, wherein:

the selected interleaving configuration supports Ramsey Type II interleaving.

* * * * *